US011699996B2

(12) United States Patent
Lin et al.

(10) Patent No.: US 11,699,996 B2
(45) Date of Patent: Jul. 11, 2023

(54) METHOD FOR PROXIMITY SENSING AND APPLIED ELECTRONIC DEVICE THEREOF

(71) Applicant: SENSORTEK TECHNOLOGY CORP., Jhubei (TW)

(72) Inventors: Wang-An Lin, Jhubei (TW); Ming-Che Yang, Jhubei (TW); Kai Fan Hsieh, Jhubei (TW); Chung-Jung Wu, Jhubei (TW)

(73) Assignee: Sensortek Technology Corp., Jhubei (TW)

( * ) Notice: Subject to any disclaimer, the term of this patent is extended or adjusted under 35 U.S.C. 154(b) by 0 days.

(21) Appl. No.: 17/301,494

(22) Filed: Apr. 5, 2021

(65) Prior Publication Data

US 2022/0057852 A1 Feb. 24, 2022

Related U.S. Application Data

(60) Provisional application No. 63/005,432, filed on Apr. 5, 2020.

(51) Int. Cl.
*G06F 1/00* (2006.01)
*H03K 17/955* (2006.01)
*H03K 17/96* (2006.01)
*G01R 27/26* (2006.01)
*G01V 3/08* (2006.01)
*G06F 1/3231* (2019.01)
*G06F 3/01* (2006.01)

(52) U.S. Cl.
CPC ....... *H03K 17/955* (2013.01); *G01R 27/2605* (2013.01); *G01V 3/088* (2013.01); *G06F 1/3231* (2013.01); *G06F 3/011* (2013.01); *H03K 17/962* (2013.01)

(58) Field of Classification Search
CPC ............ H03K 17/955; H03K 17/962; H03K 2217/960705; H03K 17/945; G01R 27/2605; G01V 3/088; G06F 1/3231; G06F 3/011
See application file for complete search history.

(56) References Cited

U.S. PATENT DOCUMENTS

| 9,459,238 B1 | 10/2016 | Konopka et al. | |
| 2005/0083174 A1* | 4/2005 | Nakamura | E05B 81/78 340/5.72 |
| 2016/0164563 A1* | 6/2016 | Khawand | H04W 52/221 455/127.2 |
| 2017/0285866 A1* | 10/2017 | Heim | G06F 3/04182 |
| 2020/0005053 A1 | 1/2020 | Lee | |

FOREIGN PATENT DOCUMENTS

| CN | 1602381 A | 3/2005 |
| CN | 101042434 A | 9/2007 |
| CN | 110045370 A | 7/2019 |

OTHER PUBLICATIONS

Taiwanese Patent Office Official Action dated Sep. 6, 2021 for corresponding TW Application No. 110112450.

* cited by examiner

*Primary Examiner* — Zhipeng Wang
(74) *Attorney, Agent, or Firm* — Rosenberg, Klein & Lee

(57) ABSTRACT

The present invention is related to a method for proximity sensing and an applied electronic device thereof. The present invention provides that a movement signal is generated according to a detection data, a move baseline data and a move threshold and cooperated with a proximity signal for generating a judgement signal to judge if the human body or the object body is close to the electronic device.

22 Claims, 6 Drawing Sheets

METHOD FOR PROXIMITY SENSING AND APPLIED ELECTRONIC DEVICE THEREOF

FIELD OF THE INVENTION

The present invention relates to a judging method and circuit thereof, particularly a method for proximity sensing and an applied electronic device thereof.

BACKGROUND OF THE INVENTION

The SAR(Specific Absorption Rate) value is a standard for the electromagnetic wave radiation of mobile phones, which represents the electromagnetic power absorbed or consumed by a unit mass of human tissue. Under the rapid development of wireless communication technologies, personal mobile phone data cards (including mobile phones, data cards, and MiFi/Hotspot, etc.) now are widely popularized and applied thereof. In daily application scenarios, the distance between the said products and the human body is getting closer; the impact of electromagnetic radiation on human health coming from mobile phone data cards has become a public concern. To reduce the influence of electromagnetic radiation on the human body, a proximity detection mechanism was developed to determine whether or not the human body is approaching electronic device. However, the proximity detection mechanism of the electronic device may not accurately determine whether the electronic device is getting the proximity of the human body or the proximity of the object.

According to the aforesaid problem, the present invention provides a proximity sensing method and an applied electronic device thereof and circuit, which uses an movement signal working with a proximity signal to further determine whether the electronic device gets a human body proximity or an object proximity; furthermore, it may prevent the power reduction under an object proximity.

SUMMARY

One objective of the present invention is to provide a proximity sensing method and an electronic device thereof, which generates the corresponded movement signals according to the detection data, the move baseline data and the move threshold, and cooperates with the proximity signal to determine whether the electronic device gets a human body proximity or an object proximity; and the power reduction is prevented under the proximity of the object.

The present invention discloses a proximity sensing method, which first a move baseline data is generated according to a detection data; next, an movement signal is generated according to the detection data, the move baseline data and a move threshold, and a judging signal is generated according to the movement signal and a proximity signal, in which the judging signal indicates that an object proximity or a human body proximity. Hereby, the power reduction is prevented under the object proximity.

The present invention further discloses an electronic device, which comprises a detection circuit, a baseline generating circuit, and a proximity detecting circuit. The baseline generating circuit generates an move baseline data according to a detection data generated by the detection circuit. The baseline generating circuit generates a movement signal according to the detection data, the move baseline data, and a move threshold. The proximity detecting circuit generates a proximity signal according to the detection data and generates a judging signal according to the movement signal and the proximity signal. The judging signal indicates an object proximity or a human body proximity. Thus, the power reduction is prevented under the object proximity.

DETAILED DESCRIPTION

Since in the conventional proximity detection mechanism, it is impossible to judge whether the object proximity is occurred or not, and the problem of power reduction occurs under the object proximity. Therefore, the present invention is to provide a proximity sensing method and an applied electronic device thereof, which may simultaneously generate a movement signal and a proximity signal to recognize that the human body is approaching and reduce the power in response, and to avoid the problem of reducing power when an object is approaching.

Certain words are used in the invention description and claims to refer to specific components. However, the person having ordinary skill in the art should understand that manufacturers may use different terms to refer to the same element; the present invention description and claims do not use different names as the manner to distinguish components; instead, we use the overall technical difference of the components as the distinguishing criterion. The "comprises/include" mentioned in the entire invention description and claims is an open term, which should be interpreted as "comprise/include but not limited to". Furthermore, the term "coupled to" includes the direct and indirect connection means. Therefore, if a first device is coupled to a second device, it means that the first device may be directly connected to the second device, or it may be indirectly connected to the second device through other devices or other connecting means.

Thereinafter we will further interpret a proximity sensing method and the characteristics and structures of its electronic device in a proximity sensing method disclosed in the present invention.

Figure 1:
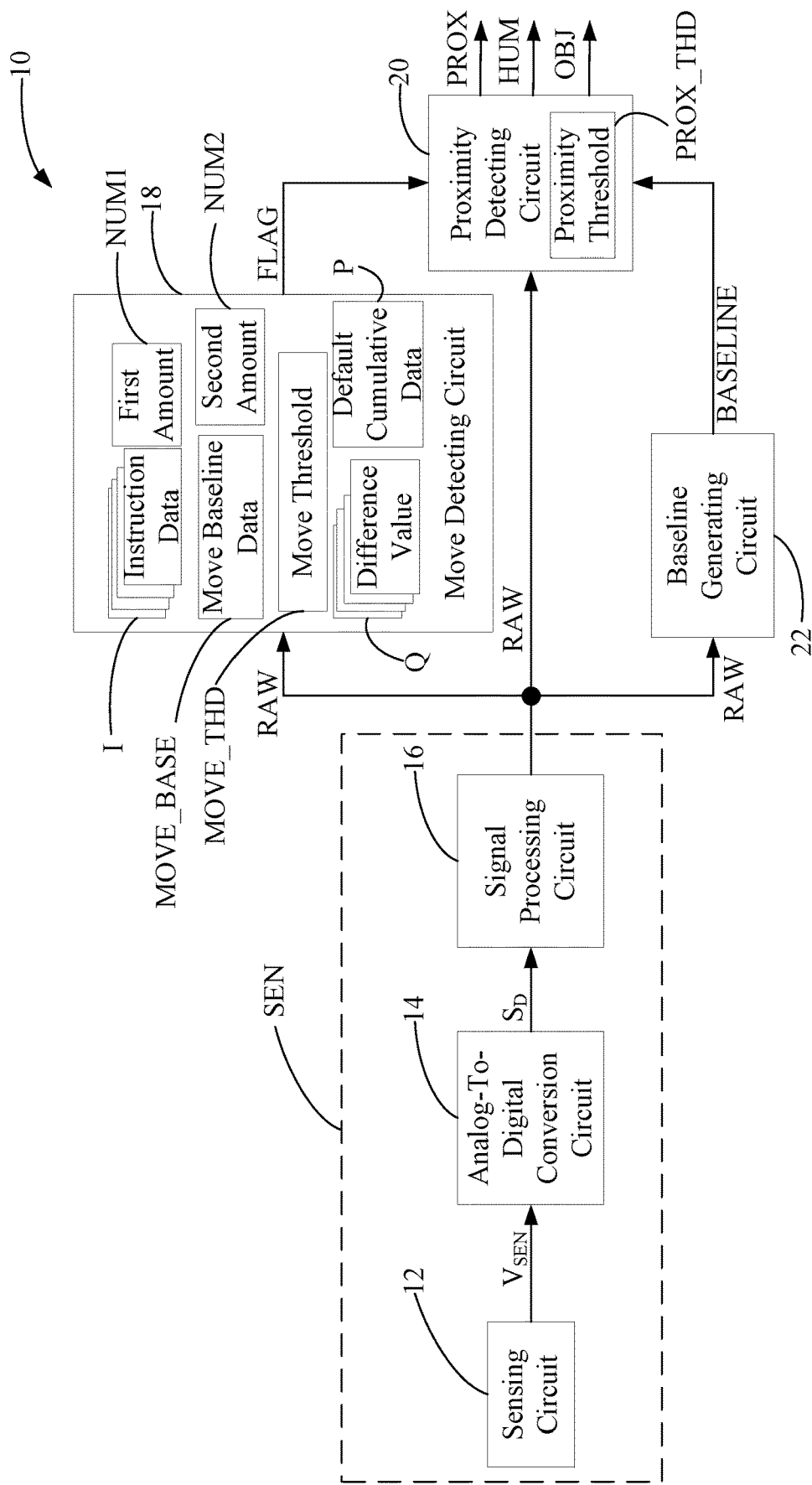
FIG. 1 shows a block diagram of the electronic device according to an embodiment of the present invention.

First, refer to FIG. 1, which is the block diagram of the electronic device according to an embodiment of the present invention. As shown in FIG. 1, the electronic device 10, applied in the proximity sensing method of the present invention, includes a detection circuit SEN, a move detecting circuit 18, and a proximity detecting circuit 20, the detection circuit SEN may include a sensing circuit 12, an analog-to-digital conversion circuit 14, and a signal processing circuit 16. According to an embodiment of the present invention, the sensing circuit 12 is a capacitance sensing circuit, which includes a sensing electrode (not shown in figures) equipped in the electronic device 10 acted as a capacitor; the equivalent capacitance of the sensing electrode will be influenced by a human body or an object, such as the human body, stylus or desk, etc. The sensing circuit 12 may transmit a signal to the sensing electrode, and the sensing electrode will generate an electrical signal, such as voltage or electric charges, which is related to the equivalent capacitance of the sensing electrode. The sensing circuit 12 generates a sensing signal $V_{SEN}$ according to the electrical signal of the sensing electrode; the sensing signal $V_{SEN}$ is related to the equivalent capacitance of the sensing electrode; the sensing signal $V_{SEN}$ is an analog signal according to an embodiment of the present invention.

Refer to FIG. 1, again; the analog-to-digital conversion circuit 14 is coupled to the sensing circuit 12, converting the sensing signal $V_{SEN}$ of the sensing circuit 12 into a digital signal $S_D$. The signal processing circuit 16 is coupled to the analog-to-digital conversion circuit 14 for operating and processing the digital signal $S_D$ to generate a detection data RAW. The numerical value of the detection data RAW represents the equivalent capacitance of the sensing electrode. The signal processing circuit 16 is coupled to the move detecting circuit 18 and the proximity detecting circuit 20 for transmitting the detection data RAW to the move detecting circuit 18 and the proximity detecting circuit 20. In an embodiment of the present invention, the signal processing circuit 16 may receive several digital signals $S_D$ and take an average of the digital signals $S_D$ as a value of the detection data RAW; or the average won't be taken, an adigital signal $S_D$ is taken as a value of the detection data RAW. The signal processing circuit 16 also may filter the digital signal $S_D$ to remove the noise. The move detecting circuit 18 is coupled between the signal processing circuit 16 and the proximity detecting circuit 20 and generates a move baseline data MOVE_BASE according to the detection data RAW; a movement signal FLAG is generated by the move detecting circuit 18 to the proximity detecting circuit 20 according to the detection data RAW, the move baseline data MOVE_BASE and a move threshold MOVE_THD in move detecting circuit 18. The electronic device 10 of the present invention further comprises a baseline generating circuit 22, which is also coupled between the signal processing circuit 16 and the proximity detecting circuit 20. The baseline generating circuit 22 generates a baseline data BASELINE according to the detection data RAW and transmits the baseline data BASELINE to the proximity detecting circuit 20.

The move detecting circuit 18 generates the movement signal FLAG according to the detection data RAW, the move baseline data MOVE_BASE, and a move threshold MOVE_THD; the aforesaid proximity detecting circuit 20 generates a proximity signal PROX according to the detection data RAW, the baseline data BASELINE, and a proximity threshold PROX_THD; the proximity signal PROX may indicate the condition of a human body proximity or an object proximity of the electronic device. In an embodiment of the present invention, the value of the proximity signal PROX indicated as 1 to express the condition of a human body proximity or an object proximity of the electronic device. But, the present invention isn't limited to this embodiment. The value of the proximity signal PROX also may be indicated as 0 to express the condition of a human body proximity or an object proximity of the electronic device. In an embodiment of the present invention, the proximity detecting circuit 20 may further generate the human body identifying signal HUM for judging if a human body proximity is occurred, and generate the object identifying signal OBJ for judging if an object proximity is occurred. But, this application isn't limited to this embodiment; the embodiment may work with the proximity signal PROX and only using the human body identifying signal HUM or the object identifying signal OBJ to judge whether the human body proximity or the object proximity. Further, the embodiment may work with the proximity signal PROX and using the human body identifying signal HUM and the object identifying signal OBJ to judge whether the human body proximity or the object proximity. If the human body identifying signal HUM and the object identifying signal OBJ are disabled, it expresses that there is no proximity event. In addition, the proximity detecting circuit 20 may judge if the proximity signal PROX is valid, if judging to not valid, it expresses that the electronic device has no human body proximity nor object proximity. The following examples illustrate the proximity detection method of the present invention in detail.

Figure 2A:
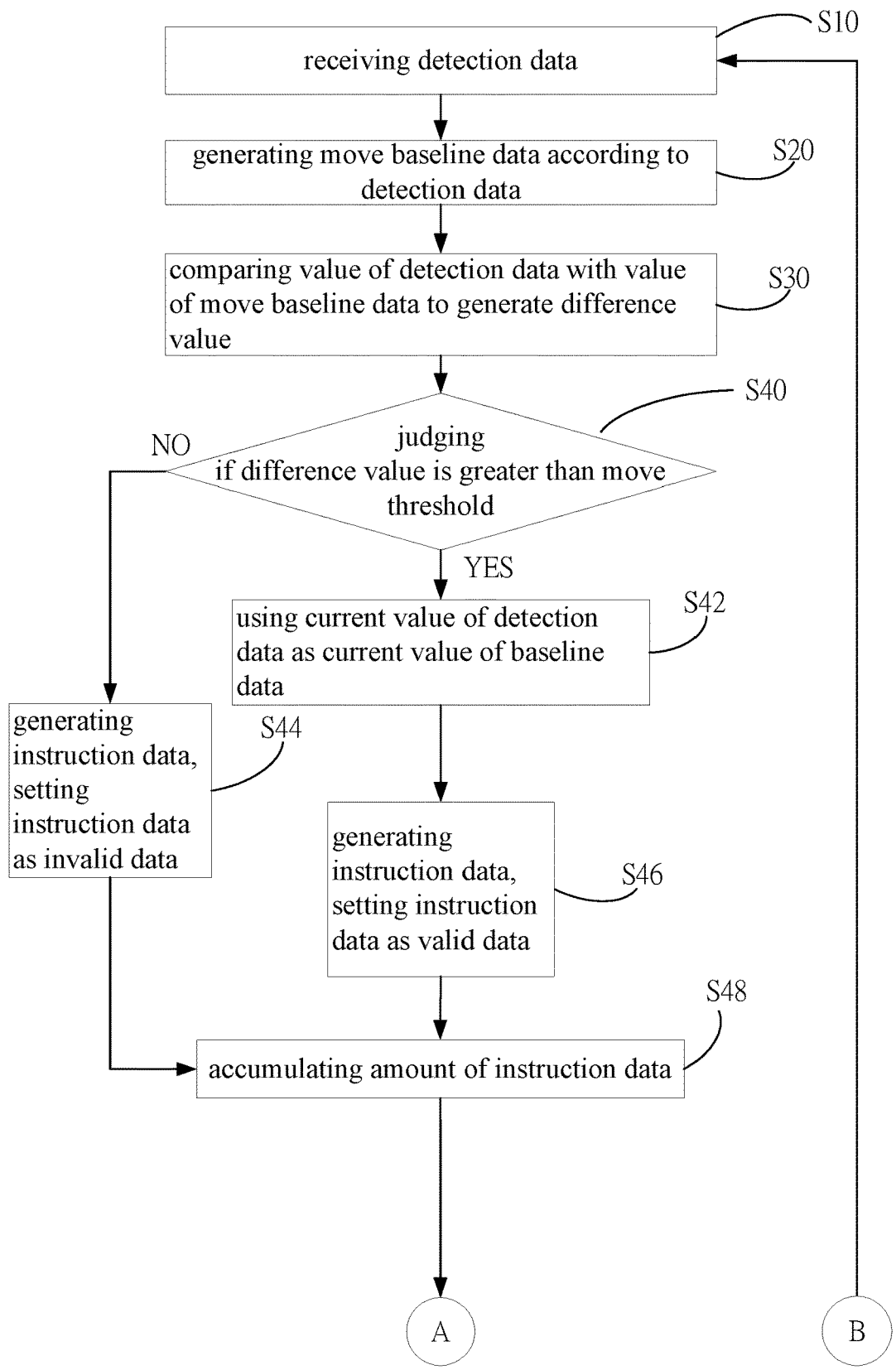
FIG. 2A shows a partial flowchart of the proximity sensing method according to an embodiment of the present invention.
Figure 2B:
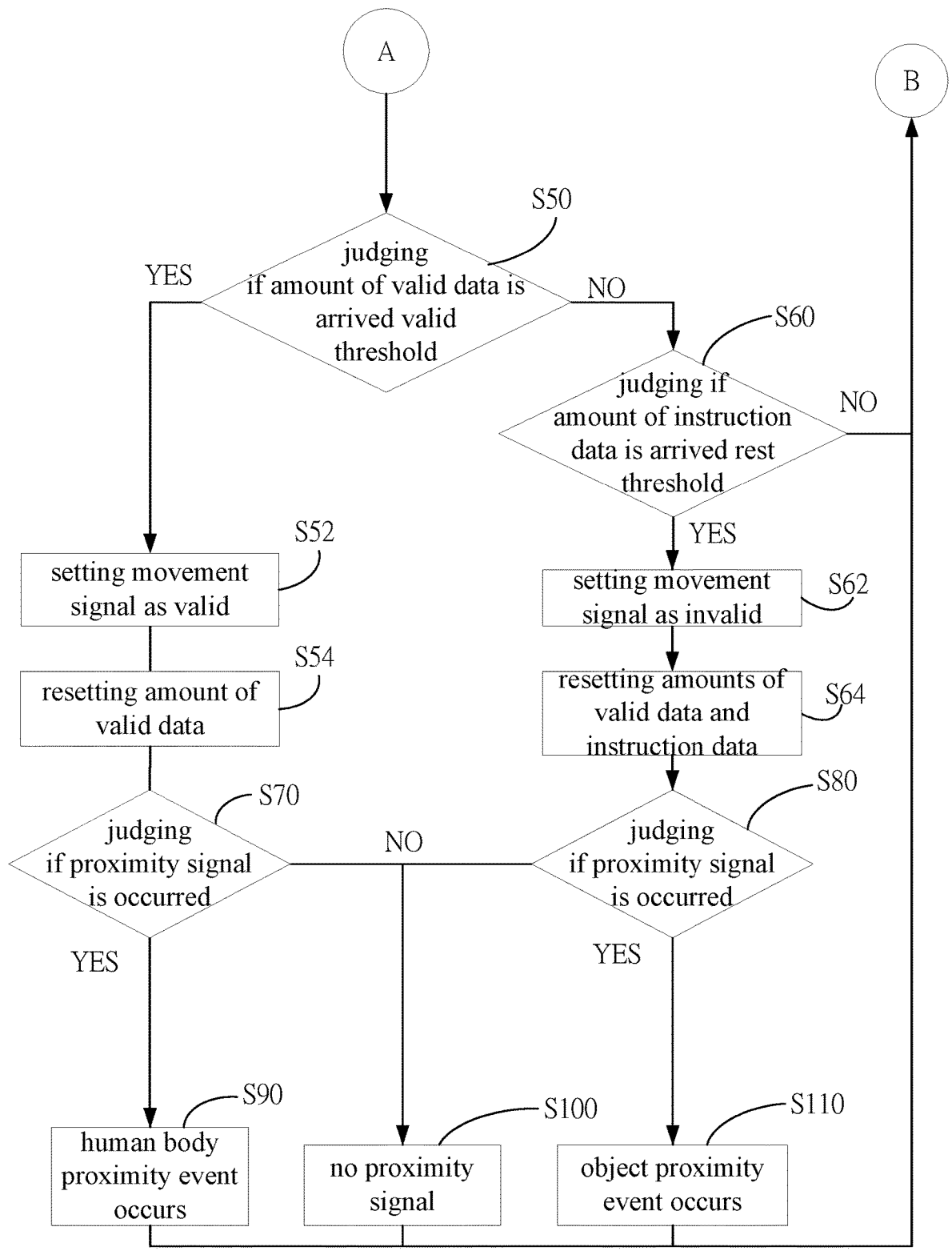
FIG. 2B shows a partial flowchart of the proximity sensing method according to an embodiment of the present invention.

Refer to FIG. 2A and FIG. 2B, which are the flowchart of the proximity sensing method according to an embodiment of the present invention. As shown in the figure, the proximity sensing method according to the present invention is applied for the proximity sensing of an electronic device; the steps of the proximity sensing method includes:

Step S10: receiving the detection data;
Step S20: generating the move baseline data according to the detection data;
Step S30: comparing the value of the detection data with the value of the move baseline data and generating the difference value;
Step S40: judging if the difference value is greater than the move threshold, if judging to yes, execute Step S42, else, execute Step S44;
Step S42: replacing current value of the baseline data with current value of the detection data;
Step S44: generating the instruction data, setting the instruction data as invalid data;
Step S46: generating the instruction data, setting the instruction data as valid data;
Step S48: accumulating amount of the instruction data;
Step S50: judging if amount of the valid data is arrived the valid threshold, if judging to yes, execute Step S52; else, execute Step S60;
Step S52: setting the movement signal as valid;
Step S54: resetting amount of the valid data;
Step S60: judging if amount of the instruction data is arrived the reset threshold, if judging to yes, execute Step S62, else, execute Step S10;
Step S62: setting the movement signal as invalid;
Step S64: resetting amounts of the valid data and the instruction data;
Step S70: judging if the proximity signal is occurred, if judging to yes, execute
Step S90, else, execute Step S100;
Step S80: judging if the proximity signal is occurred, if judging to yes, execute
Step S110: else, execute Step S100;
Step S90: human body proximity event occurs;
Step S100: no proximity signal; and
Step S110: object proximity event occurs.

Figure 3:
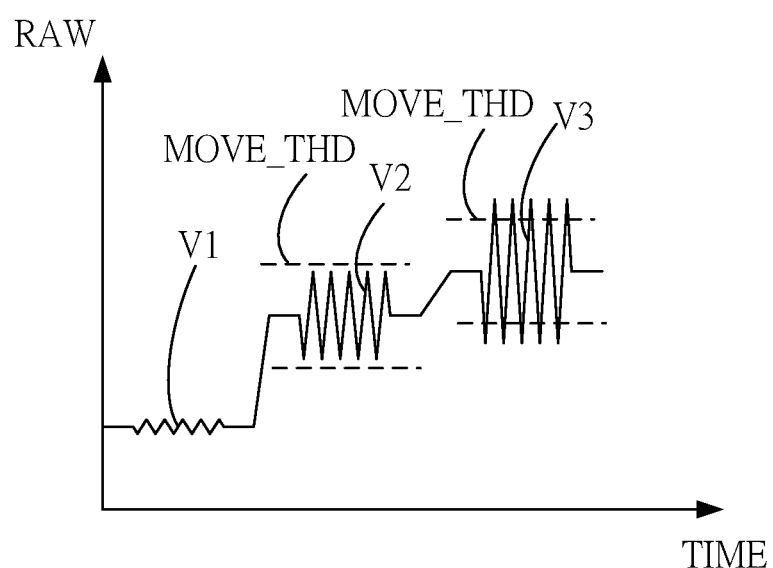
FIG. 3 shows a schematic diagram of the detection signal according to an embodiment of the present invention.

Refer to FIG. 1; executing Step S10; the detection circuit SEN generates the detection data RAW to make the move detecting circuit 18, the proximity detecting circuit 20 and the baseline generating circuit 22 receive the detection data RAW. As shown in FIG. 3, the value of the detection data RAW will be corresponding to three signal types: the first detection data V1 is the result of no proximity, the second detection data V2 is the result of the object proximity, and the third detection data V3 is the result of the human body proximity. Next to Step S20, the move detecting circuit 18 generates the move baseline data MOVE_BASE according to the detection data RAW; for example, the n−1$^{th}$ value of the move baseline data MOVE_BASE is generated according to the n$^{th}$ value of the detection data RAW, and the n$^{th}$ value of the move baseline data MOVE_BASE is generated according to the n+1th value of the detection data RAW. The move baseline data MOVE_BASE may be expressed as MOVE_Base[n]=Gm*Raw[n]+(1−Gm)*MOVE_Base[n−1], where Gm is a parameter, the Gm is positive value and less than 1, which may be set according to the requirements. To execute Step S30, the move detecting circuit 18 compares a plurality of values of the detection data RAW with a plurality of values of the move baseline data MOVE_BASE to generate a plurality of difference values Q; for example, the current value (n$^{th}$) of the detection data RAW is compared with the last value (n−$^{th}$) of the move baseline data MOVE_BASE to generate the n$^{th}$ difference value Q; and the next value (n+1$^{th}$) of the detection data RAW is compared with the current value (n$^{th}$) of the move baseline data MOVE_BASE to generate the n+1$^{th}$ difference value Q and the same goes on comparison to generate a plurality of difference values Q. The above n is a positive integer and greater than 1.

Next to Step S40; the move detecting circuit 18 judges if the difference value Q generated in Step S30 is greater than the move threshold MOVE_THD. Where the move threshold MOVE_THD is shown in FIG. 3, representing that the second detection data V2 of object proximity won't exceed the move threshold MOVE_THD, whereas the third detection data V3 of human body proximity will exceed the move threshold MOVE_THD. When the difference value Q exceeds the move threshold MOVE_THD, execute Step S42, the current value (n$^{th}$) of the detection data RAW is used as the current value (n$^{th}$) of the move baseline data MOVE_BASE; while the n+1$^{th}$ difference value is greater than the move threshold MOVE_THD, executing Step S42, the next (n+1$^{th}$) value of the detection data RAW is used as the next value (n+1$^{th}$) of the move baseline data MOVE_BASE.

For example, when the second difference value Q is greater than the move threshold MOVE_THD, the second value of the detection data RAW is used as the second value of the move baseline data MOVE_BASE. When the third difference value Q is greater than the move threshold MOVE_THD, the third value of the detection data RAW is used as the third value of the move baseline data MOVE_BASE. When the difference value Q is smaller than the move threshold MOVE_THD, executing Step S44. The instruction data I (the n$^{th}$ instruction data) is generated and the instruction data I (the n$^{th}$ instruction data) is set as an invalid data. Execute Step S46, when the n$^{th}$ difference value Q is greater than the move threshold MOVE_THD, the move detecting circuit 18 generates the instruction data I (the n$^{th}$ instruction data) and sets the instruction data I (the n$^{th}$ instruction data) as a valid data.

Refer to FIG. 1, FIG. 2A and FIG. 2B, execute Step S48, the amount of the instruction data I generated in Step S42 and Step S46 is accumulated, and the move detecting circuit 18 counts the total amount of the instruction data I currently buffered as the first amount NUM1 and the amount of the valid data of the instruction data I currently buffered as the second amount NUM2. Next to Step S50, judging if the amount (the second amount NUM2) of the valid data of the instruction data I has reached a valid threshold for judging if the movement signal FLAG is set as valid. That is, the default amount of the valid data in the default accumulative data P is used as the valid threshold by the move detecting circuit 18 for judging if the second amount NUM2 has reached the valid threshold in the default cumulative data P. When the second amount NUM2 has reached the valid threshold in the default accumulative data P, executing Step S52 and the movement signal FLAG is set as valid. For example, the value of the movement signal FLAG is set as 1. When the second amount NUM2 fails to reach the valid threshold in the default cumulative data P, execute Step S60. Executing Step S54; after setting the movement signal FLAG as valid immediately, reset the amount of the valid data in the instruction data I to 0, that is, the second amount NUM2 is reset to 0, and next to Step S70.

Continue to above, the move detecting circuit 18 set the default total amount of the instruction data I in the default accumulative data P as the reset threshold, and judge if the total amount of the instruction data I have been reached the reset threshold of the default accumulative data P. When the move detecting circuit 18 judges that the first amount NUM1 fails to arrive the reset threshold of the default accumulative data P, next to Step S10 and continuously inputting the detection data RAW to the move detecting circuit 18, and continuous accumulating the number of the instruction data I (the first amount NUM1) for reaching the reset threshold of the default accumulative data P. For example, the reset threshold of the default accumulative data P is set to 30 instruction data, when the amount of instruction data is less than 30, return to Step S10; until the amount of instruction data arrives 30. When the move detecting circuit 18 judges that the amount of the instruction data I has met the reset threshold of the default accumulative data P, go to Step S62; the movement signal FLAG is set as invalid, for example, set the value of the movement signal FLAG is set to 0 and go to Step S64, to reset the amount of the instruction data I and the valid data thereof, and go to Step S80.

Figure 2C:
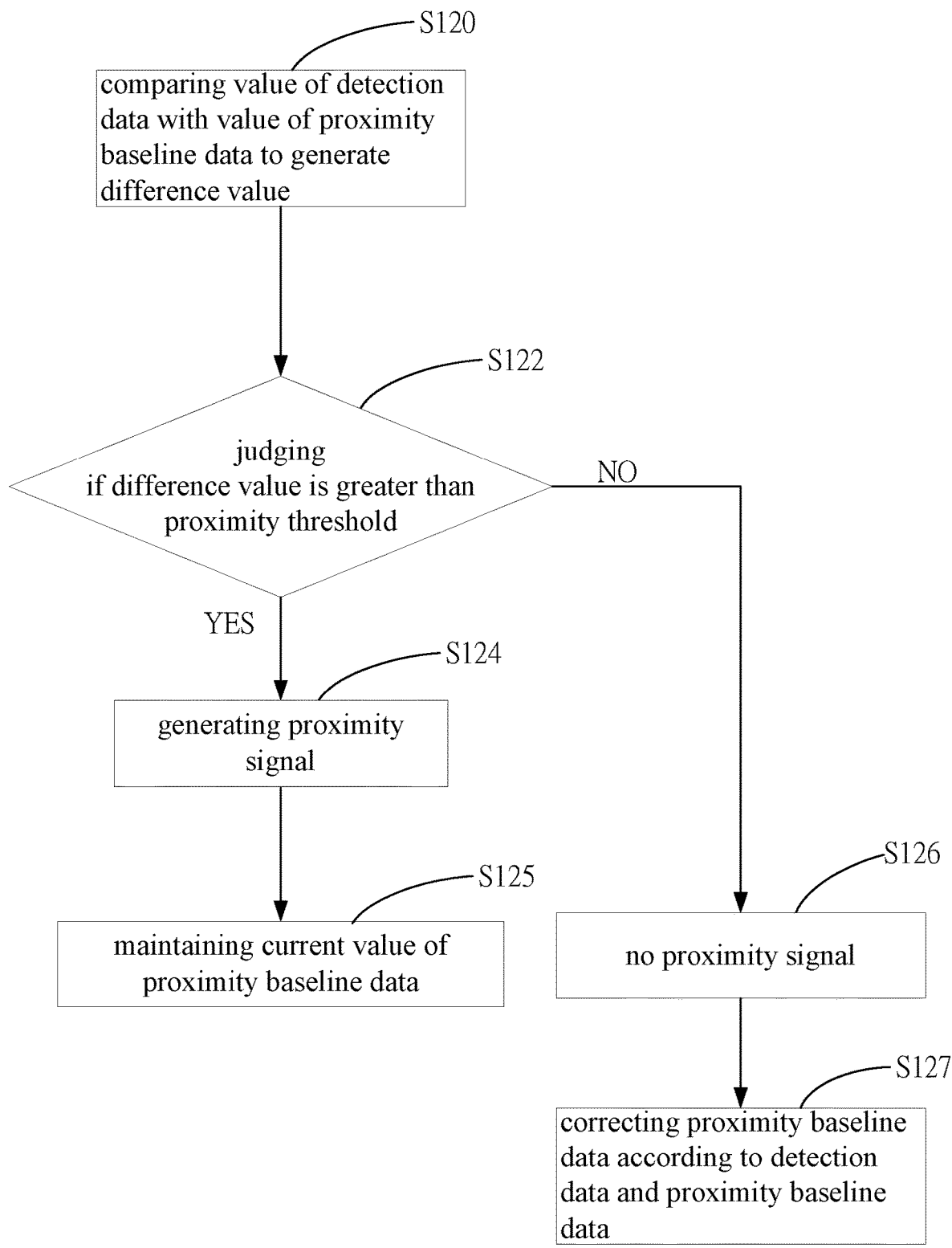
FIG. 2C shows a flowchart of judging if the proximity signal is occurred according to an embodiment of the present invention.

Refer to FIG. 1 and FIG. 2B; Step S70 and Step S80 are substantially identical, both are the proximity detecting circuit 20 to judge if the proximity signal PROX is occurred; the detailed operation is shown in FIG. 2C, which is the flowchart of judging if the proximity signal is occurred according to an embodiment of the present invention. As shown in FIG. 2C, the steps of judging if the proximity signal is occurred according to the present invention includes:

Step S120: comparing value of the detection data with value of the proximity baseline data to generate the difference value;

Step S122: judging if the difference value is greater than the proximity threshold, if judging to yes, go to Step S124; else, go to Step S126;

Step S124: generating the proximity signal;

Step S125: maintaining current value of the proximity baseline data;

Step S126: no proximity signal; and

Step S127: correcting the proximity baseline data according to the detection data and the proximity baseline data.

Execute Step S120 above, that is, no matter whether or not the movement signal FLAG has been generated, the current value of the detection data RAW should be compared with the former value of the proximity baseline data Baseline to generate the difference value Q, the baseline generating circuit 22 generates the proximity baseline data BASELINE according to the detection data RAW. For example, the n−1$^{th}$ value of the proximity baseline data BASELINE is generated according to the $n^{th}$ value of the detection data RAW; the $n^{th}$ value of the proximity baseline data BASELINE is generated according to the $n+1^{th}$ value of the detection data RAW. The proximity baseline data BASELINE may be expressed as Baseline data $[n]=G*Raw[n]+(1-G)*$ Baseline $[n-1]$, wherein G is a parameter, G is positive value and less than 1, and may be set according to the requirements. While executing Step S120, the move detecting circuit 18 compares a plurality of values of the detection data RAW with a plurality of values of the proximity baseline data BASELINE to generate a plurality of difference value Q. For example, the current value ($n^{th}$) of the detection data RAW is compared with the former value ($n-1^{th}$) of the proximity baseline data BASELINE to generate the $n^{th}$ difference value Q; and the next value ($n+1^{th}$) of the detection data RAW is compared with the current value ($n^{th}$) of the proximity baseline data BASELINE to generate the $n+1^{th}$ difference value Q. That is, a plurality of the difference value Q are generated according to the proximity baseline data BASELINE. Next to Step S122, the difference value Q generated in Step S120 is compared with the proximity threshold PROX_THD to judge if the difference value Q is greater than the proximity threshold PROX_THD; if judging to yes, go to Step S124; else, go to Step S126.

Continue to above, executing Step S124, the proximity detecting circuit 20 generates the proximity signal PROX, in meanwhile, go to Step S125, maintaining the proximity baseline data BASELINE. Executing Step S126, the proximity signal PROX won't be generated. Executing Step S127, the proximity detecting circuit 20 corrects the proximity baseline data BASELINE according to the detection data RAW and the proximity baseline data BASELINE, that is, the proximity baseline data BASELINE is modified according to the formula Baseline $[n]=G*Raw[n]+(1-G)*$ Baseline $[n-1]$ and the modified value is set as the current value ($n^{th}$) of the proximity baseline data BASELINE.

Refer to FIG. 1, FIG. 2A and FIG. 2B; as shown in Step S70, when the proximity detecting circuit 20 judges that the proximity signal PROX is occurred, next to Step S90, that is, when a human body proximity event is occurred, thereby, the electronic device 10 is driven to reduce power thereof according to the judging signal. When the proximity detecting circuit 20 judges that no proximity signal PROX is occurred, execute Step S100, that is, there is no proximity signal to be judged. As shown in Step S80, when the proximity detecting circuit 20 judges that the proximity signal PROX is occurred, execute Step S110, that is, when an object proximity event is occurred, the electronic device 10 is not driven to reduce power of the electronic device 10. When the proximity detecting circuit 20 judges that there is no proximity signal PROX, execute Step S100, that is, there is no proximity event to be judged. After Step S90 to Step S110 are completed, executing Step S10 according to path B.

In Step S44 and Step S46 of the above embodiment, except the above-mentioned accumulative method, the move detecting circuit 18 may directly count the number of the cases that the difference values Q generated by the Step S30 are greater than the move threshold MOVE_THD, and also count the number of the results in that the difference values Q generated by the Step S30 are less than the move threshold MOVE_THD; and make statistics on the results that the difference values generated by the Step S30 are greater or less than the move threshold MOVE_THD, which will be equivalent to use counter counting the number of the results in that the difference values are greater or less than the move threshold MOVE_THD, for judging if the movement signal FLAG is generated.

Except for the aforesaid embodiment, the proximity sensing method disclosed in the present invention may ignore to accumulate the instruction data I and buffer the instruction data; and will eliminate the earliest instruction data to perform the shifting.

Figure 4:
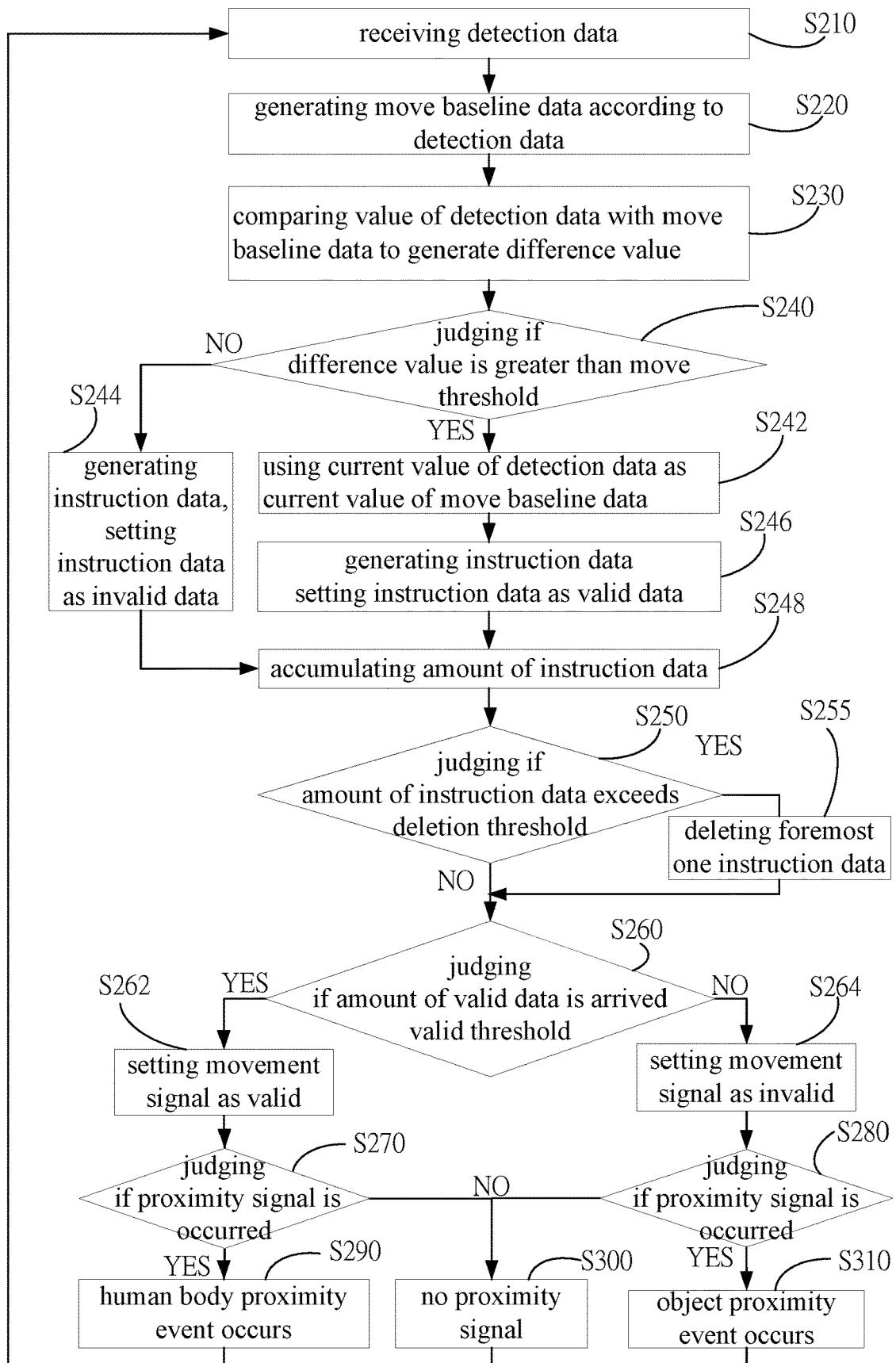
FIG. 4 shows a flowchart of the proximity sensing method according to another embodiment of the present invention.

As shown in FIG. 4, which is the flowchart of the proximity sensing method according to another embodiment of the present invention. As shown in the figure, the proximity sensing method of the present invention includes the following steps:

Step S210: receiving the detection data;
Step S220: generating the move baseline data according to the detection data;
Step S230: comparing value of the detection data with the value of the move baseline data to generate difference value;
Step S240: judging if the difference value is greater than the move threshold, if judging to yes, go to Step S242; else, go to Step S244;
Step S242: using current value of the detection data as current value of the move baseline data;
Step S244: generating the instruction data, setting the instruction data as invalid data;
Step S246: generating the instruction data, setting the instruction data as valid data;
Step S248: accumulating amount of the instruction data;
Step S250: judging if amount of the instruction data is arrived the deletion threshold, if judging to yes, execute Step S255, else, execute Step S260;
Step S255: deleting foremost one instruction data;
Step S260: judging if amount of the valid data is arrived the valid threshold, if judging to yes, execute Step S262; else, execute Step S264;
Step S262: setting the movement signal as valid;
Step S264: setting the movement signal as invalid;
Step S270: judging if the proximity signal is occurred, if judging to yes, execute
Step S290, else, execute Step S300;
Step S280: judging if the proximity signal is occurred, if judging to yes, execute
Step S310, else, execute Step S300;
Step S290: human body proximity event occurs;
Step S300: no proximity signal; and
Step S310: object proximity event occurs.

Step S210 to Step S248 are identical to mentioned Step S10 to Step S48, hereby, the detailed description won't be repeated. Execute Step S250, judging if the amount of the instruction data I accumulated in Step S248 is greater than the deletion threshold of the default accumulative data P. If judging that the amount is greater than the deletion threshold of the default accumulative data P, next to Step S255; If judging that the amount is less than the deletion threshold of the default accumulative data P, next to Step S260. Executing Step S255, for a plurality of buffered instruction data I, when the $n^{th}$ instruction data I is equal to the deletion threshold and the move detecting circuit 18 adds an $n+1^{th}$ instruction data I, the move detecting circuit 18 will delete the foremost one instruction data; for example, if the deletion threshold is 30 instruction data; when the move detecting circuit 18 adds the $31^{st}$ instruction data, the move detecting circuit 18 will delete the $1^{st}$ instruction data, which is equivalent to shift the buffered instruction data I. Step S260 is equivalent to the executing manner of Step S50. However, while judged to be yes, go to Step S262; while judged to be no, go to Step S264. Step S262 is equivalent to Step S52, Step S264 is equivalent to Step S62, and Step S290 to Step S310 is equivalent to Step S90 to Step S110, hereby, the detailed description won't be repeated.

In summary, in the present invention, the method for proximity sensing and the applied electronic device thereof, generate a move baseline data according to a detection data. A movement signal is generated according to the detection data, the move baseline data and a move threshold. A judging signal is generated according to the movement signal and a proximity signal. The judging signal indicates an object proximity or a human body proximity. Thus, the power reduction is prevented in the circumstance of the object proximity.

Those skilled in the art will readily observe that numerous modifications and alterations of the circuit and structure may be made while retaining the teachings of the invention. Accordingly, the above disclosure should be construed as limited only by the metes and bounds of the appended claims.

The invention claimed is:

1. A proximity sensing method, comprising:
generating a move baseline data according to a detection data;
generating a movement signal according to the detection data, the move baseline data and a move threshold;
generating a proximity baseline data according to the detection data;
generating a proximity signal according to the detection data, the proximity baseline data and a proximity threshold; and
generating a judging signal according to the movement signal and the proximity signal, the judging signal indicating an object proximity or a human body proximity.

2. The proximity sensing method of claim 1, further comprising:
comparing a plurality of values of the detection data with a plurality of values of the move baseline data to generate a plurality of difference values; and
judging if the difference values are greater than the move threshold, and generating the movement signal.

3. The proximity sensing method of claim 2, further comprising:
setting a plurality of instruction data, the instruction data corresponding to the difference values, wherein when the difference value is greater than the move threshold, setting the corresponding instruction data as a valid data and generating the movement signal according to the valid data;
when the difference value is less than the move threshold, setting the corresponding instruction data as an invalid data.

4. The proximity sensing method of claim 3, further comprising:
comparing an amount of the valid data with a valid threshold, wherein when the amount of the valid data is arrived the valid threshold, setting the movement signal as valid; when the amount of the valid data is less than the valid threshold, setting the movement signal as invalid.

5. The proximity sensing method of claim 4, further comprising:
comparing an amount of the instruction data with a reset threshold, wherein when the amount of the instruction data is arrived the reset threshold, resetting the amount of the instruction data and the amount of the valid data.

6. The proximity sensing method of claim 4, further comprising:
comparing an amount of the instruction data with a deletion threshold, wherein when the amount of the instruction data exceeds the deletion threshold, deleting the foremost one instruction data.

7. The proximity sensing method of claim 2, further comprising:
comparing a $n^{th}$ value of the detection data with a $n-1^{th}$ value of the move baseline data to generate a $n^{th}$ difference value of the difference values, wherein when the $n^{th}$ difference value is greater than the move threshold, setting the $n^{th}$ value of the detection data as an $n^{th}$ value of the move baseline data, and comparing a $n+1^{th}$ value of the detection data with the $n^{th}$ value of the move baseline data to generate a $n+1^{th}$ difference value of the difference values as well as generating a $n+1^{th}$ value of the move baseline data according to the $n+1^{th}$ value of the detection data and the $n^{th}$ value of the move baseline data, wherein n is a positive integer and greater than 1.

8. The proximity sensing method of claim 7, further comprising:
generating the $n-1^{th}$ value of the move baseline data according to a $n-1^{th}$ value of the detection data and a $n-2^{th}$ value of the move baseline data, wherein n is greater than 2.

9. The proximity sensing method of claim 1, further comprising:
comparing a current value of the detection data with a former value of the proximity baseline data to generate a difference value; and
judging if the difference value is greater than the proximity threshold, and generating the proximity signal.

10. The proximity sensing method of claim 9, wherein when the difference value is greater than the proximity threshold, maintain a current value of the proximity baseline data; when the difference value is less than the proximity threshold, generating the current value of the proximity baseline data according to the current value of the detection data and the former value of the proximity baseline data.

11. The proximity sensing method of claim 1, wherein when the movement signal is valid, the judging signal indicates a human body proximity; when the movement signal is invalid, the judging signal indicates an object proximity.

12. An electronic device, comprising:
a detection circuit, generating a detection data;
a move detecting circuit, coupled to the detection circuit, generating a move baseline data according to the detection data, and generating a movement signal according to the detection data, the move baseline data and a move threshold;
a baseline processing circuit, coupled to the detection circuit and generating a proximity baseline data according to the detection data; and
a proximity detecting circuit, coupled to the detection circuit, generating a proximity signal according to the detection data, the proximity baseline data and a proximity threshold, and generating a judging signal according to the movement signal and the proximity signal, wherein the judging signal indicates an object proximity or a human body proximity.

13. The electronic device of claim 12, wherein the move detecting circuit compares a plurality of values of the detection data with a plurality of values of the move baseline data to generate a plurality of difference values, and respectively judges if the difference values are greater than the move threshold, and generating the movement signal.

14. The electronic device of claim 13, wherein the move detecting circuit sets a plurality of instruction data, the instruction data are corresponding to the difference values, when the difference value is greater than the move threshold, setting the corresponding instruction data as a valid data and generating the movement signal according to the valid data; when the difference value is less than the move threshold, setting the corresponding instruction data as an invalid data.

15. The electronic device of claim 14, wherein the move detecting circuit compares an amount of the valid data with a valid threshold, when the amount of the valid data is arrived the valid threshold, the movement signal is set as valid; when the amount of the valid data is less than the valid threshold, the movement signal is set as invalid.

16. The electronic device of claim 15, wherein the move detecting circuit compares an amount of the instruction data with a reset threshold, when the amount of the instruction data is arrived the reset threshold, the move detecting circuit resets the amount of the instruction data and the amount of the valid data.

17. The electronic device of claim 15, wherein the move detecting circuit compares an amount of the instruction data with a deletion threshold, when the amount of the instruction data is greater than the deletion threshold, the move detecting circuit deletes the foremost one of the instruction data.

18. The electronic device of claim 13, wherein the move detecting circuit compares a $n^{th}$ value of the detection data with a $n-1^{th}$ value of the move baseline data to generate a $n^{th}$ difference value of the difference values, wherein when the $n^{th}$ difference value is greater than the move threshold, the $n^{th}$ value of the detection data is set as a $n^{th}$ value of the move baseline data, and a $n+1^{th}$ value of the detection data is compared with the $n^{th}$ value of the move baseline data to generate a $n+1^{th}$ difference value of the difference values, a $n+1^{th}$ value of the move baseline data is generated according to the $n+1^{th}$ value of the detection data and the $n^{th}$ value of the move baseline data, where n is a positive integer and greater than 1.

19. The electronic device of claim 18, wherein the move detecting circuit further generates the $n-1^{th}$ value of the move baseline data according to a $n-1^{th}$ value of the detection data and a $n-2^{th}$ value of the move baseline data.

20. The electronic device of claim 12, wherein the proximity detecting circuit comparing a current value of the detection data with a former value of the proximity baseline data to generate a difference value, judging if the difference value is greater than the proximity threshold, and generating the proximity signal.

21. The electronic device of claim 20, wherein when the difference value is greater than the proximity threshold, the baseline processing circuit maintains a current value of the proximity baseline data; when the difference value is less than the proximity threshold, the baseline processing circuit generates a current value of the proximity baseline data according to the current value of the detection data and the former value of the proximity baseline data.

22. The electronic device of claim 12, wherein when the movement signal is valid, the judging signal indicates the human body proximity; when the movement signal is invalid, the judging signal indicates the object proximity.

* * * * *